United States Patent
Rumsey et al.

(10) Patent No.: US 6,815,128 B2
(45) Date of Patent: Nov. 9, 2004

(54) BOX-IN-BOX FIELD-TO-FIELD ALIGNMENT STRUCTURE

(75) Inventors: Robert W. Rumsey, Campbell, CA (US); Martin E. Garnett, Los Gatos, CA (US)

(73) Assignee: Micrel, Inc., San Jose, CA (US)

( * ) Notice: Subject to any disclaimer, the term of this patent is extended or adjusted under 35 U.S.C. 154(b) by 27 days.

(21) Appl. No.: 10/114,701

(22) Filed: Apr. 1, 2002

(65) Prior Publication Data

US 2003/0186132 A1 Oct. 2, 2003

(51) Int. Cl.$^7$ ................................................ G03F 9/00
(52) U.S. Cl. ..................... 430/22; 257/797; 257/48; 430/5; 430/22; 430/616; 438/481; 438/462; 438/975
(58) Field of Search ................... 257/797, 48; 438/401, 438/462, 475; 430/5, 22, 616

(56) References Cited

U.S. PATENT DOCUMENTS 5,017,514 A * 5/1991 Nishimoto .................. 438/14
5,250,983 A * 10/1993 Yamamura .................. 355/125
6,027,859 A * 2/2000 Dawson et al. ............. 430/312
6,319,791 B1 * 11/2001 Ando ......................... 438/401
6,713,843 B2 * 3/2004 Fu ............................. 257/620

* cited by examiner

Primary Examiner—Allan R. Wilson
Assistant Examiner—Edgardo Ortiz
(74) Attorney, Agent, or Firm—Patent Law Group, LLP; David C. Hsia (57) ABSTRACT

A lithographic pattern includes a first scribe along an edge of a die region, and a second scribe along an opposing edge of the die region. The first scribe includes at least a first translucent box and a second translucent box. The second scribe includes at least a first opaque box and a second opaque box defined respectively by a first translucent frame and a second translucent frame. When the lithographic pattern is stepped between fields on a wafer, the first translucent box is placed at least partially within the first opaque box, and the second translucent box is placed at least partially within the second opaque box. If a continuous ring is formed from a pair of a translucent box and an opaque box, the fields are aligned at least within an amount equal to the difference between the dimensions of that translucent box and that opaque box divided by 2.

11 Claims, 9 Drawing Sheets

BOX-IN-BOX FIELD-TO-FIELD ALIGNMENT STRUCTURE

FIELD OF THE INVENTION

This invention relates to test structure patterns used in semiconductor manufacturing, and in particular to optical alignment test structure patterns on photomasks used to determine field-to-field alignment of a stepper in a lithographic process.

DESCRIPTION OF RELATED ART

Photomasks are an integral component in the lithographic process of semiconductor manufacturing. Semiconductor manufacturers use photomasks to optically transfer (e.g., print) images of devices (e.g., integrated circuits) onto semiconductor wafers. A lithography tool called stepper projects light through the photomask to print the image of one or more devices onto a field on a silicon wafer coated with photoresist. The stepper then moves (e.g., steps) the wafer and the image is exposed once again onto another field on the wafer. This process is repeated for the entire wafer surface. When using a positive photoresist, the exposed portions of the photoresist are removed so areas of the wafer underneath can either be etched to form channels or be deposited with other materials. This process can be reversed using a negative photoresist where the unexposed portions of the photoresist are removed.

Figure 1:
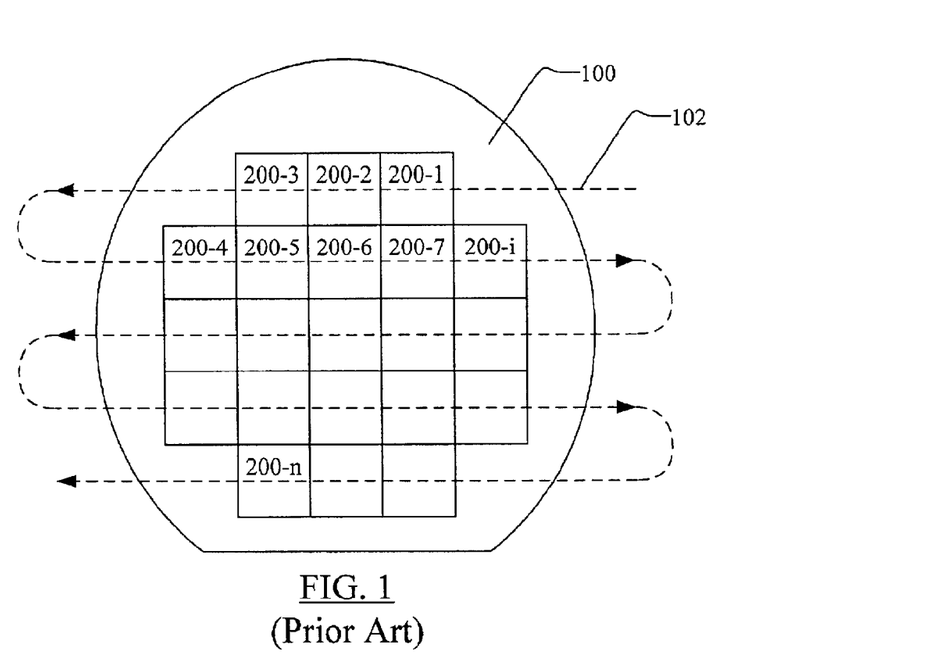
FIG. 1 illustrates a conventional path of a stepper in photolithography.

FIG. 1 illustrates a path 102 of a stepper on a wafer 100 coated with photoresist. The stepper prints the image of one or more devices on fields 200-1, 200-2 ... 200-$i$ ... 200-$n$ on wafer 100, where "i" and "n" are variables.

Figure 2:
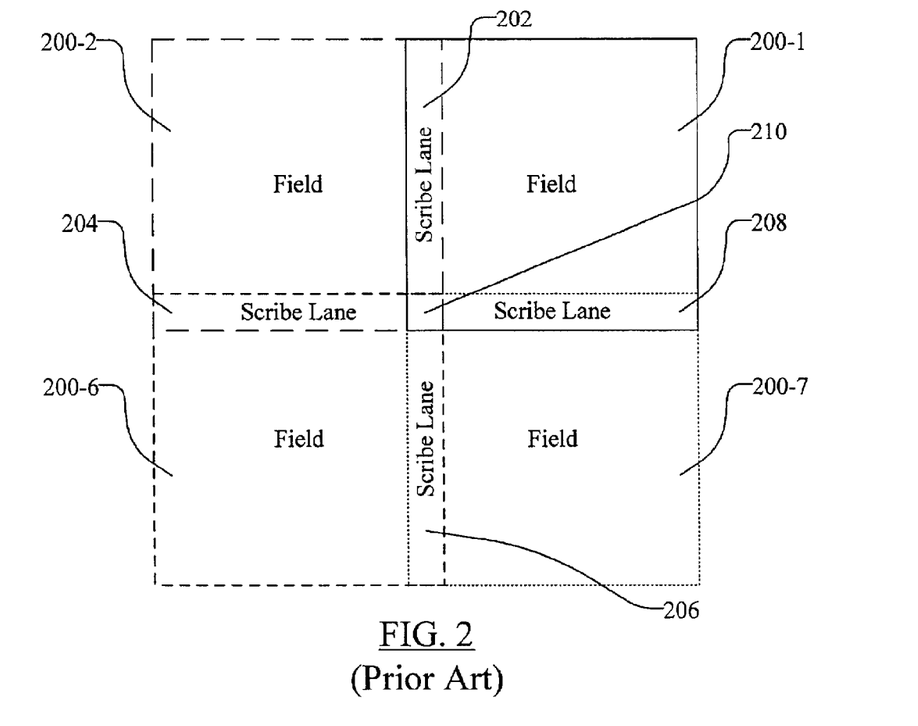
FIG. 2 illustrates a number of conventional fields with overlapping scribe lanes on a wafer.

FIG. 2 illustrates that each field partially overlaps neighboring fields in scribe lanes (also known as "scribe lines" or "scribe streets") where a dicing tool cuts to separate the fields. For example, the left edge of field 200-1 and the right edge of field 200-2 overlap in scribe lanes 202 and 210, the lower edge of field 200-1 and the upper edge of field 200-7 overlap in scribe lanes 208 and 210, and the lower left corner of field 200-1 and the upper right corner of field 200-6 overlap in scribe lane 210. Similarly, the upper edge of field 200-6 and the lower edge of field 200-2 overlap in scribe lanes 204 and 210, and the right edge of field 200-6 and the left edge of field 200-7 overlap in scribe lanes 206 and 210.

In lithography, field-to-field alignment of the stepper is critical because it impacts all future masking alignments, wafer sort, and ultimately the assembly process. If the field alignment is poor, it directly impacts sort yield and assembly yield. The assembly process can be halted if the field-to-field alignment is so poor that the dicing tool cuts into the production die and damages the die and itself.

Thus, what is needed is a production friendly, field-to-field alignment tool that allows quick verification that the stepper has accurately placed and aligned each field relative to the neighboring fields.

SUMMARY OF THE INVENTION

In one embodiment of the invention, a field pattern includes a die region, a first scribe along an edge of the die region, and a second scribe along an opposing edge of the die region. The first scribe includes at least a first translucent box and a second translucent box. The second scribe includes at least a first opaque box and a second opaque box defined respectively by a first translucent frame and a second translucent frame.

When the field pattern is stepped between neighboring fields on a wafer, the first scribe and the second scribe overlap on a scribe lane between the fields. When the first scribe and the second scribe overlap on the scribe lane, the first translucent box is placed at least partially (ideally completely) within the first opaque box, and the second translucent box is placed at least partially within the second opaque box.

If a translucent box is placed completely inside an opaque box, only the area inside that opaque box is exposed and thus a continuous ring is formed when the resist is developed. The continuous ring indicates that the neighboring fields are aligned at least within an amount equal to the difference between the dimensions of that translucent box and that opaque box. Such a continuous ring is easily observable on the resist on top of the wafer.

If a translucent box is placed partially outside of an opaque box, an area outside of that opaque box is exposed and thus a broken ring is formed when the resist is developed. The broken ring indicates that the neighboring fields are misaligned by an amount greater than the difference between the dimensions of that translucent box and that opaque box. Such a broken ring is also easily observable on the resist on top of the wafer.

Thus, the present invention provides anybody (e.g., operators, technicians, or engineers) the ability to rapidly and accurately verify the field-to-field alignment. Wafers that fail this check can be reworked by stripping off all the resist on the wafer surface and be realigned before the pattern is permanently etched into the silicon.

DETAILED DESCRIPTION

Figure 3:
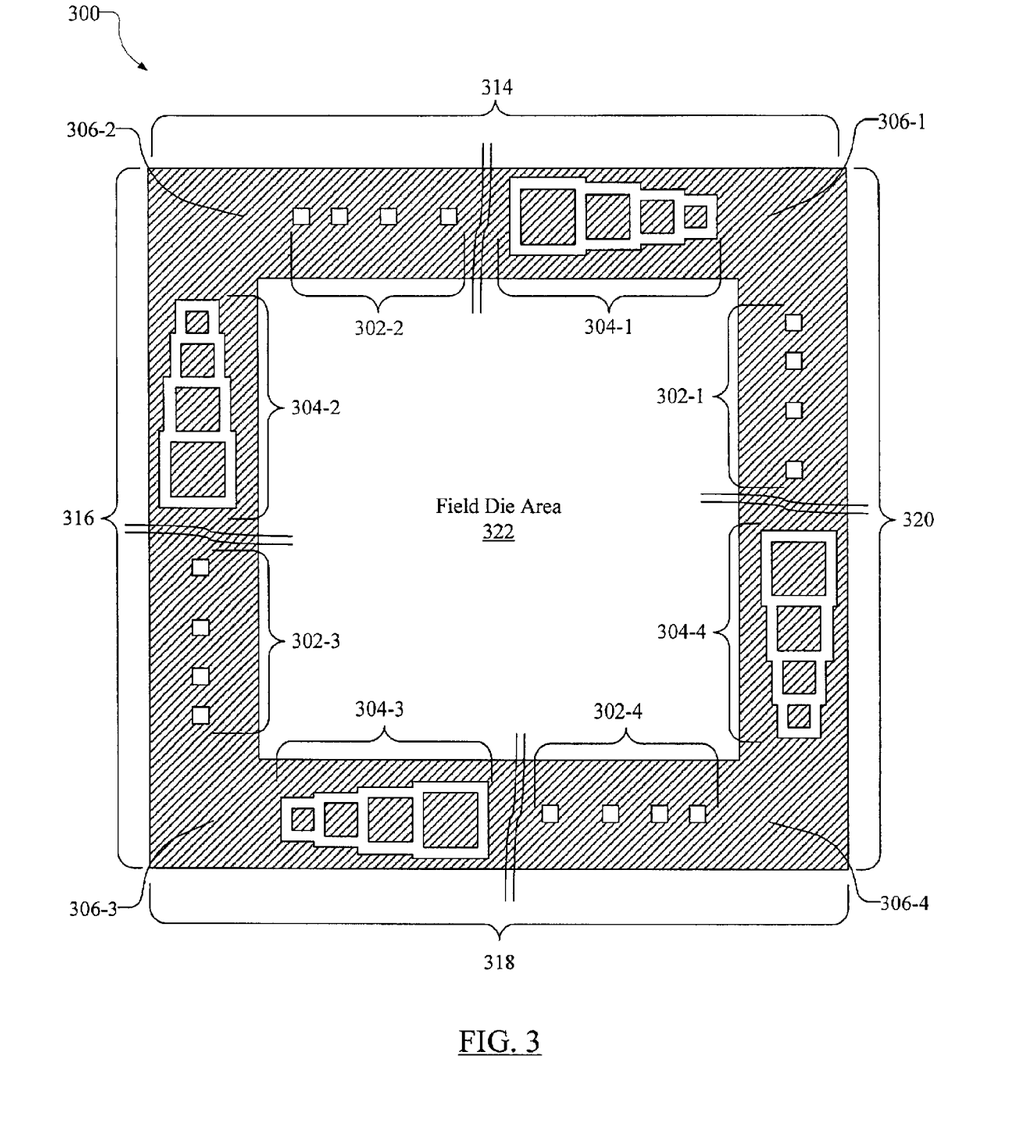
FIG. 3 illustrates a top view of test structure patterns on a photomask used with positive photoresist in accordance with one embodiment of the invention.

FIG. 3 illustrates a photomask 300 (e.g., a test structure pattern) used with positive photoresist in one embodiment of the invention. Photomask 300 includes an upper scribe 314, a left scribe 316, a lower scribe 318, and a right scribe 320 that generate the scribe lanes on a wafer. Scribes of the same orientation (e.g., vertical or horizontal) overlap each other as photomask 300 is moved from field-to-field. Photomask 300 may also include a die area 322 having the patterns of one or more devices.

Each corner region of photomask 300 includes an inner pattern of a first transmission characteristic (e.g., translucent) along a first of the two intersecting scribes, and an outer pattern of a second transmission characteristic (e.g., opaque) along a second of the two intersecting scribes. Specifically, an upper right corner region 306-1 includes a translucent inner pattern 302-1 along right scribe 320, and an opaque outer pattern 304-1 along upper scribe 314; an upper left corner region 306-2 includes a translucent inner pattern 302-2 along upper scribe 314, and an opaque outer pattern 304-2 along left scribe 316; a lower left corner region 306-3 includes a translucent inner pattern 302-3 along left scribe 316, and an opaque outer pattern 304-3 along lower scribe 318; a lower right corner region 306-4 includes a translucent inner pattern 302-4 along lower scribe 318, and an opaque outer pattern 304-4 along right scribe 320.

Figure 4:
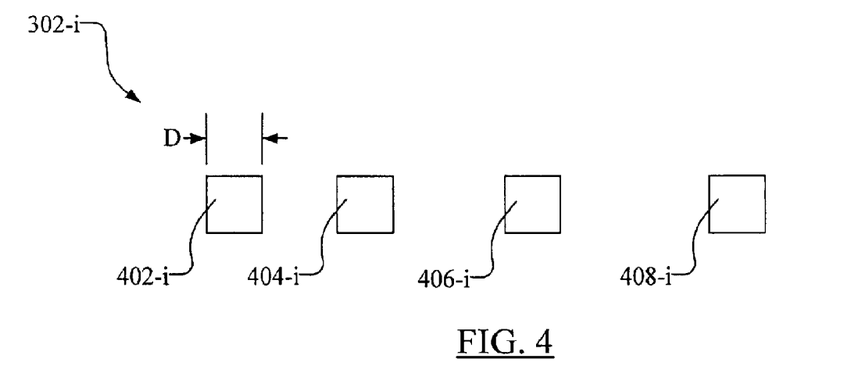
FIG. 4 illustrates an enlarged view of a translucent inner box pattern of FIG. 3 in one embodiment of the invention.

FIG. 4 illustrates an enlarged view of translucent inner pattern 302-$i$. In one embodiment, pattern 302-$i$ includes translucent inner boxes 402-$i$, 404-$i$, 406-$i$, and 408-$i$. Translucent inner boxes 402-$i$ to 408-$i$ are square and have a dimension (i.e., width and height) of D.

Figure 5:
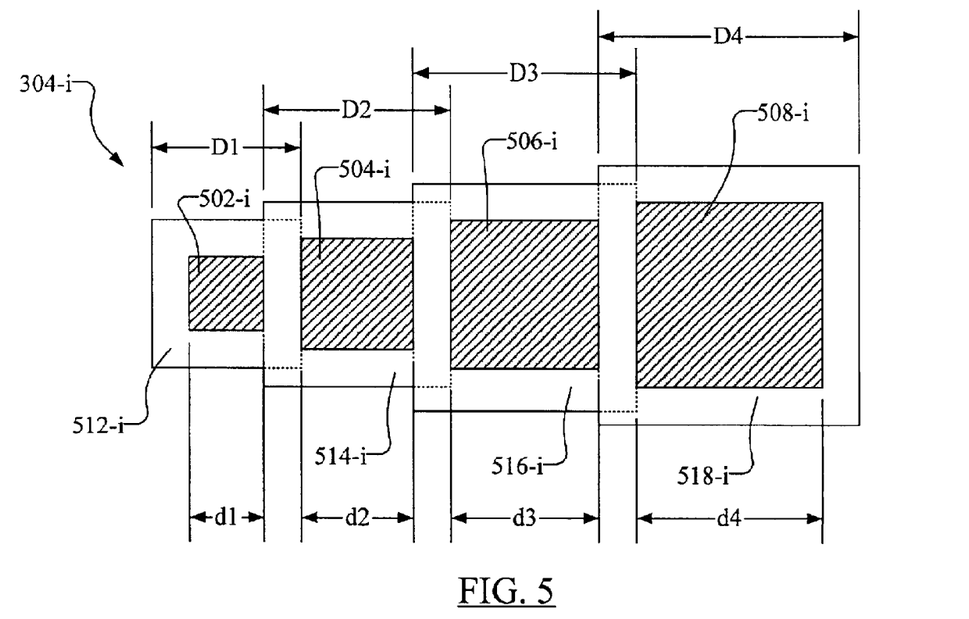
FIG. 5 illustrates an enlarged view of an opaque outer box pattern of FIG. 3 in one embodiment of the invention.

FIG. 5 illustrates an enlarged view of opaque outer pattern 304-$i$. In one embodiment, pattern 304-$i$ includes opaque outer boxes 502-$i$, 504-$i$, 506-$i$, and 508-$i$. Opaque outer boxes in a scribe at each corner region correspond to translucent inner boxes in an opposing scribe at an adjacent corner region. For example, opaque outer boxes 502-1 to 508-1 of pattern 304-1 in scribe 314 at corner region 306-1 correspond to translucent inner boxes 402-4 to 408-4 of pattern 302-4 in opposing scribe 318 at adjacent corner region 306-4.

Opaque outer boxes 502-$i$, 504-$i$, 506-$i$, and 508-$i$ are respectively defined by translucent frames 512-$i$, 514-$i$, 516-$i$, and 518-$i$. Translucent frames 512-$i$, 514-$i$, 516-$i$, and 518-$i$ are square and have respective incrementing outer dimensions (i.e., width and height) of D1, D2, D3, and D4, and respective incrementing inner dimensions (i.e., width and height) of d1, d2, d3, and d4.

In one embodiment, the edges of neighboring translucent frames overlap (as delineated by dashed lines) to minimize size. Specifically, the right edge of translucent frame 512-$i$ overlaps a part of the left edge of translucent frame 514-$i$, the right edge of translucent frame 514-$i$ overlaps a part of the left edge of translucent frame 516-$i$, and the right edge of translucent frame 516-$i$ overlaps a part of the left edge of translucent frame 518-$i$.

As the stepper moves photomask 300 between fields, the stepper will overlay corresponding translucent inner boxes and opaque outer boxes on the scribe lanes between the neighboring fields. For example, when the stepper moves photomask 300 between horizontally adjacent fields 200-1 and 200-2, translucent inner boxes 402-1 to 408-1 (of pattern 302-1) overlay corresponding opaque outer boxes 502-2 to 508-2 (of pattern 304-2) in scribe lane 202. Similarly, opaque outer boxes 502-4 to 508-4 (of pattern 304-4) overlay corresponding translucent inner boxes 402-3 to 408-3 (from pattern 302-3) in scribe lane 202.

Figure 6:
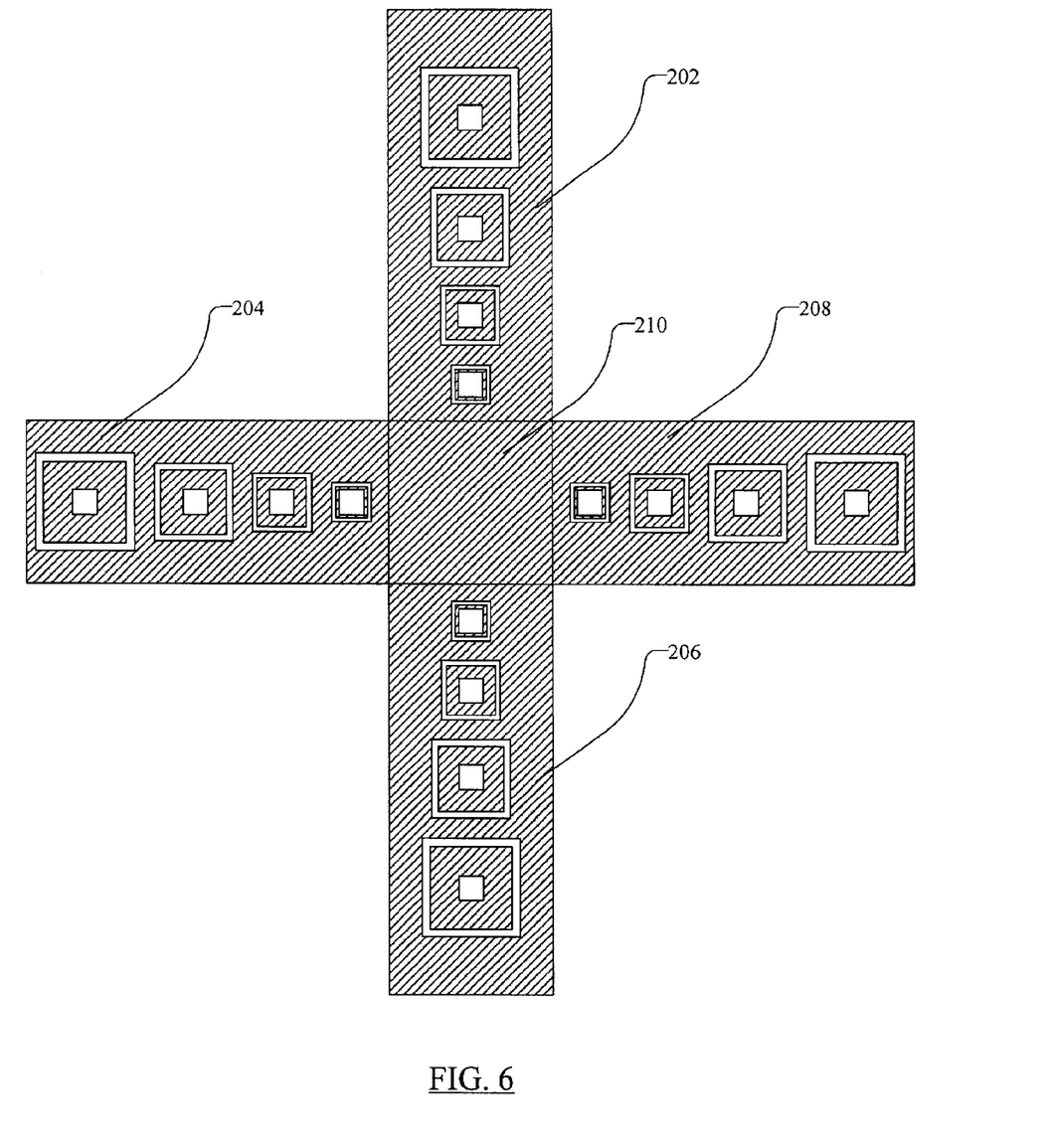
FIG. 6 illustrates a top view of the overlapped translucent inner box pattern and the opaque outer box pattern after the photomask is stepped through neighboring fields in one embodiment of the invention.

When the stepper moves photomask 300 between vertically adjacent fields 200-1 and 200-7 (after stepping through fields 200-1 to 200-6), translucent inner boxes 402-2 to 408-2 (of pattern 302-2) overlay corresponding opaque outer boxes 502-3 to 508-3 (of pattern 304-3) on scribe lane 208. Similarly, opaque outer boxes 502-1 to 508-1 (of pattern 304-1) overlay corresponding translucent inner boxes 402-4 to 408-4 (of pattern 302-4) on scribe lane 208. FIG. 6 illustrates the combined pattern of the translucent inner boxes and opaque outer boxes on the photoresist over scribe lanes 202, 204, 206, and 208 of the neighboring fields.

Figure 7:
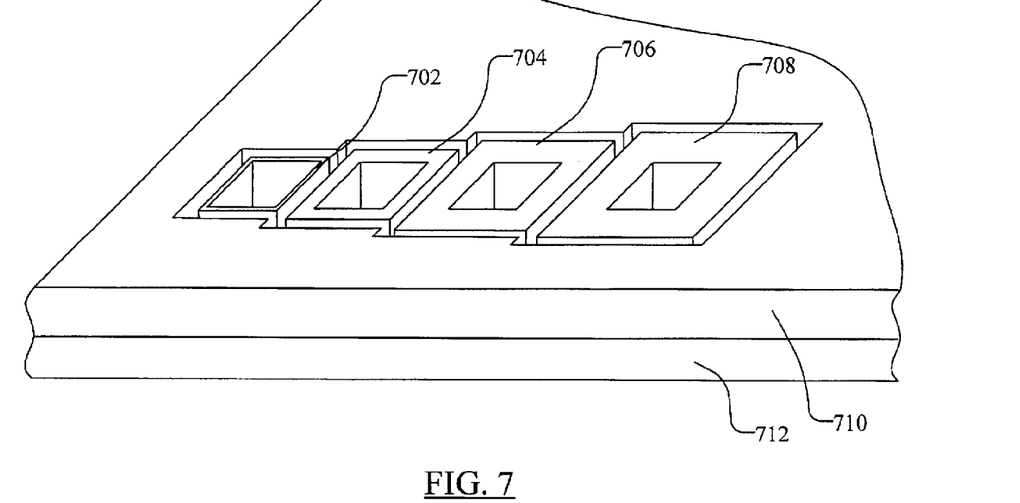
FIGS. 7 and 8 respectively illustrate perspective and top views of a test structure generated on the photoresist from exposure to the translucent and opaque box patterns with an aligned stepper in one embodiment of the invention.
Figure 8:
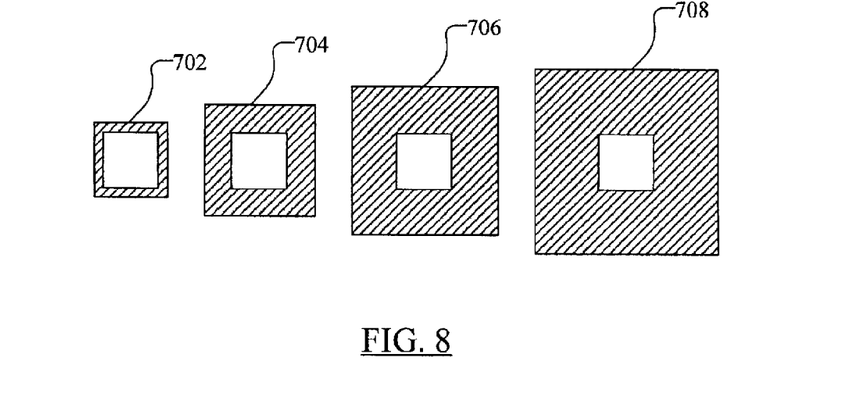

If the stepper has accurately placed and aligned the fields, translucent inner boxes 402-$i$ to 408-$i$ are placed inside corresponding opaque outer boxes 502-$i$ to 508-$i$ and only areas inside the corresponding opaque outer boxes 502-$i$ to 508-$i$ are exposed. Thus, unbroken (continuous) ring shapes are formed when the photoresist is developed. FIGS. 7 and 8 illustrate an exemplary test structure, after photoresist 710 on substrate 712 is developed, is a series of unbroken rings 702, 704, 706, and 708 when the fields are aligned.

Figure 9:
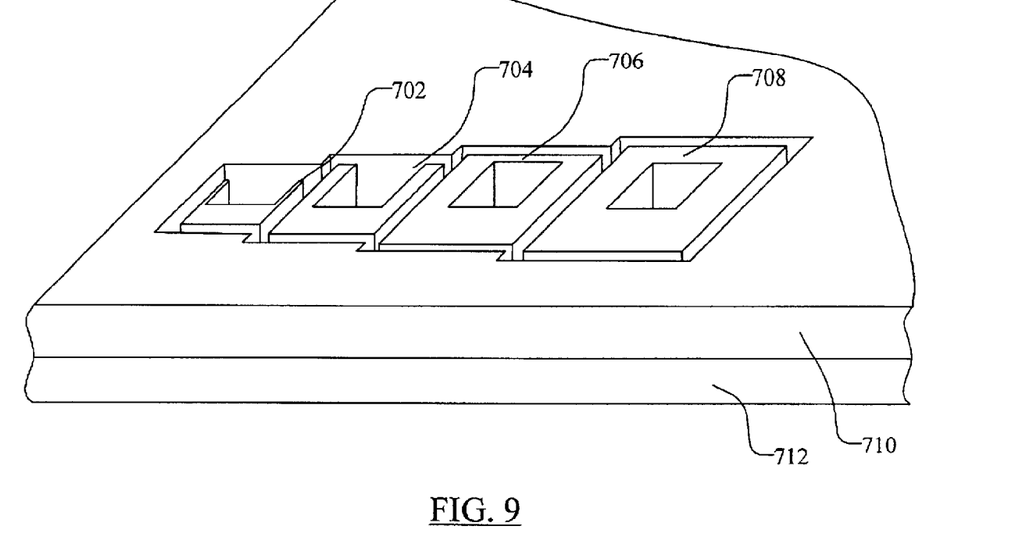
FIGS. 9 and 10 respectively illustrate perspective and top views of a test structure generated on the photoresist from exposure to the translucent and opaque box patterns with a misaligned stepper in one embodiment of the invention.
Figure 10:
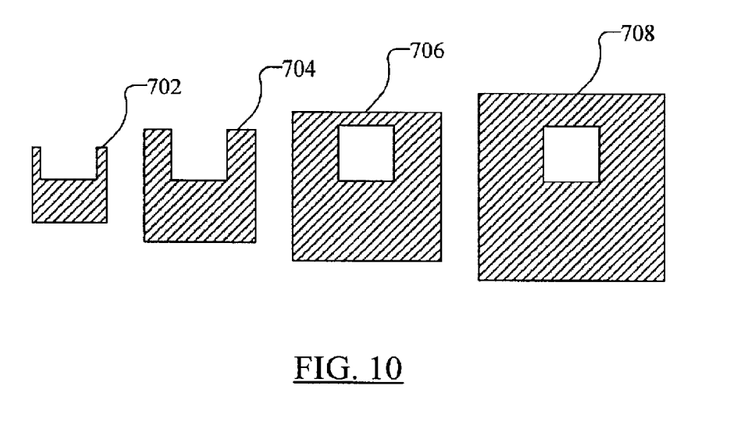

If the stepper has not accurately placed and aligned the fields, a number of translucent inner boxes 402-$i$ to 408-$i$ are placed partially outside of the corresponding opaque outer boxes 502-$i$ to 508-$i$ and areas outside corresponding opaque outer boxes 502-$i$ to 508-$i$ are exposed. In other words, a number of translucent inner boxes 402-$i$ to 408-$i$ will touch the inner perimeter of translucent frames 512-$i$ to 518-$i$. Thus, one or more broken ring shapes are formed when the photoresist is developed. FIGS. 9 and 10 illustrate an exemplary test structure, after photoresist 710 on substrate 712 is developed, is a series of broken rings 702 and 704, and unbroken rings 706 and 708, when the fields are misaligned.

A broken ring produced by a pair of a translucent inner box and an opaque outer box indicates that the stepper is misaligned by at least a specific amount. That specific amount of misalignment is the difference between (1) an outer dimension of the opaque outer box (i.e., the inner dimension of a translucent frame) and (2) the outer dimension of the translucent inner box. The following formulas define the minimum levels of misalignment indicated by each pair of translucent inner box and opaque outer box.

Inner box 402-$i$ and outer box 502-$i$: $L1=(d1-D)/2$;

Inner box 404-$i$ and outer box 504-$i$: $L2=(d2-D)/2$;

Inner box 406-$i$ and outer box 506-$i$: $L3=(d3-D)/2$;

Inner box 408-$i$ and outer box 508-$i$: $L4=(d4-D)/2$;

L1, L2, L3, and L4 are the minimum levels of misalignment.

Accordingly, the following table shows the levels of misalignment of the stepper indicated by a various combination of broken rings.

TABLE 1

|  | Pattern 1 | Pattern 2 | Pattern 3 | Pattern 4 |
| --- | --- | --- | --- | --- |
| Ring 702 | Continuous | Broken | Broken | Broken |
| Ring 704 | Continuous | Continuous | Broken | Broken |
| Ring 706 | Continuous | Continuous | Continuous | Broken |
| Ring 708 | Continuous | Continuous | Continuous | Continuous |
| Level of stepper misalignment (L) | L < L1 | L2 > L > L1 | L3 > L > L2 | L4 > L > L3 |

In one embodiment, the difference between inner dimension d2 and dimension D is the critical dimension of the devices to be manufactured. Thus, the stepper has accurately placed and aligned the fields as long as ring 704 generated from translucent inner box 404-$i$ and opaque outer box 504-$i$ is continuous.

Any person (e.g., operator, technician, or engineer) can visually inspect the developed photoresist on the wafer to determine the level of misalignment indicated by the resulting rings 702 to 708. The decrementing outer perimeters of the rings intuitively indicate to the operator the decrementing levels of misalignment. If the wafer does not pass the level of alignment required, the operator can strip off all the photoresist, adjust the stepper, and step through the fields again. If the wafer passes the level of alignment required, the operator can etch or deposit material on the silicon exposed by the developed photoresist. A fabrication masking develop inspect specification can state what level of alignment is considered to be passing or failing.

Exemplary dimensions of the translucent inner boxes 402-$i$ to 408-$i$ (FIG. 4) and the opaque outer boxes 502-$i$ to 508-$i$ (defined by their translucent frames in FIG. 5) are listed in the table below. These dimensions can be adjusted to match the desired range of misalignment to be measured. They table below is just one example of values that can be used.

TABLE 2

| Dimension | Value ($\mu$m) |
| --- | --- |
| D1 | 21 |
| D2 | 22 |
| D3 | 23 |
| D4 | 24 |
| d1 | 11 |
| d2 | 12 |
| d3 | 13 |
| d4 | 14 |
| D | 10 |

Figure 11:
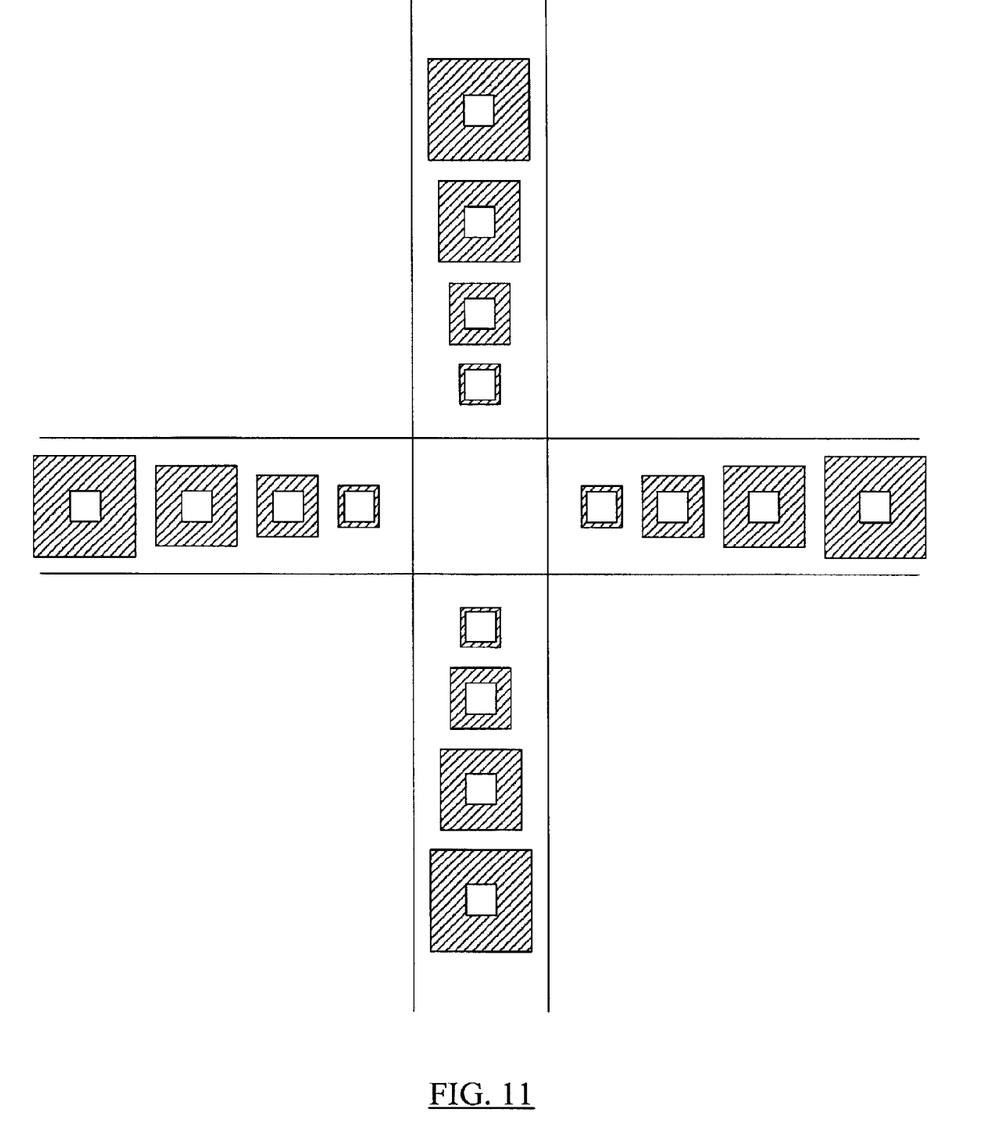
FIG. 11 illustrates a top view of the test structures generated on the photoresist of neighboring fields from exposure to the translucent and opaque box patterns with an aligned stepper in one embodiment of the invention.

FIG. 11 illustrates the intersection of four fields and the test structures generated on the photoresist on their overlapping scribe lanes. The test structures beneficially point to the intersection of the four fields to delineate the fields. The test structure is generated from the translucent inner boxes and opaque outer boxes in one embodiment of the invention. A translation misalignment of the stepper will produce one or more broken rings in the horizontal or the vertical scribe lane. A rotation misalignment of the stepper will produce one or more broken rings in the horizontal scribe lane and one or more broken rings in the vertical scribe lane.

Figure 12:
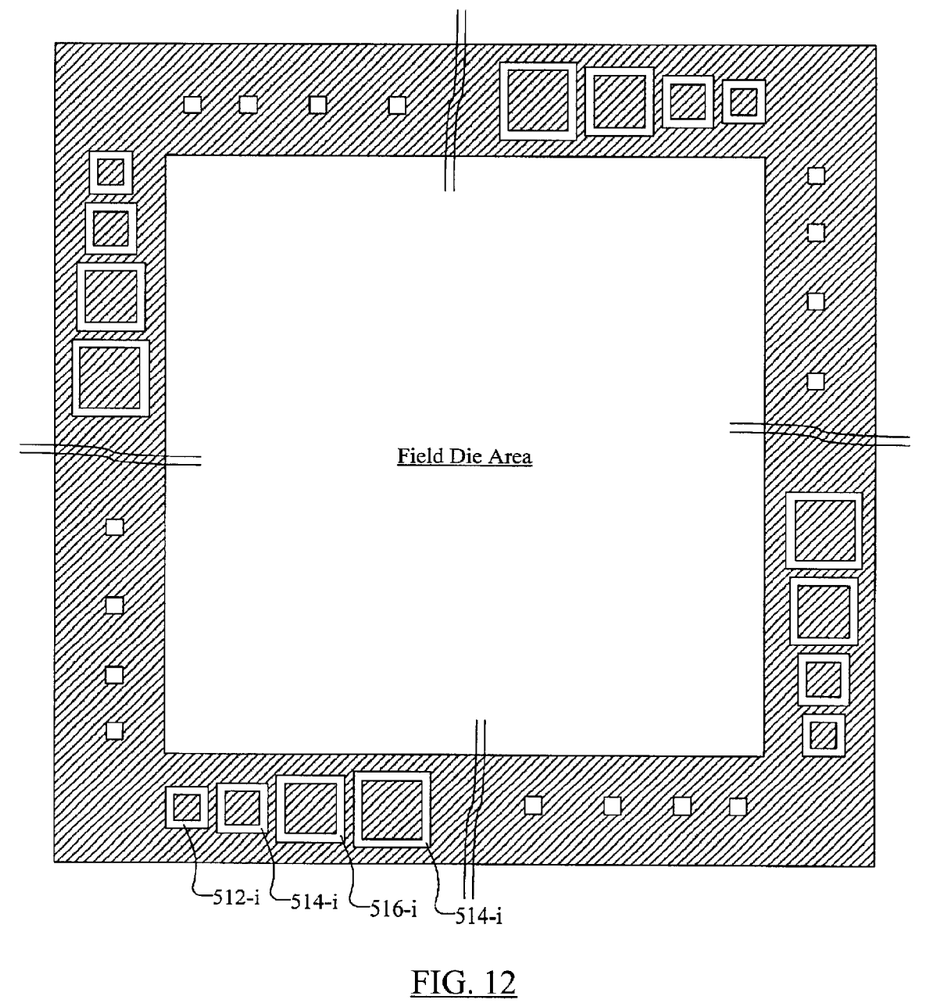
FIG. 12 illustrates a top view of test structure patterns on a photomask used with positive photoresist in accordance with another embodiment of the invention.
Figure 13:
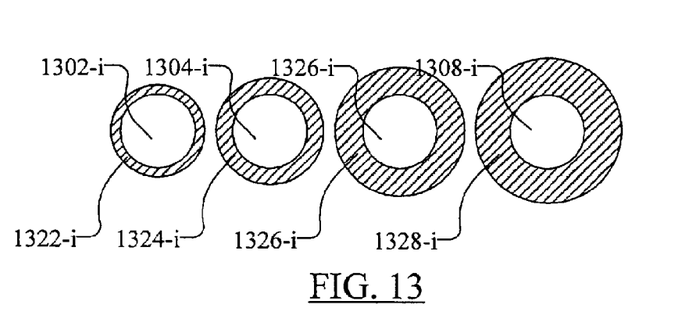
FIG. 13 illustrates a combined view of translucent and opaque circular patterns in one embodiment of the invention.

As discussed above in regards to FIG. 5, some of the edges of translucent frames 512-$i$ to 518-$i$ overlap. FIG. 12 illustrates that translucent frames 512-$i$ to 518-$i$ can be individually separated without any overlap of their edges in another embodiment. Furthermore, the translucent inner patterns and the opaque outer patterns can be circular, or of any other consistent and concentric shape, instead of square. FIG. 13 illustrates a combined view of translucent circular inner patterns 1302-$i$ to 1308-$i$ and opaque circular outer patterns 1322-$i$ to 1328-$i$.

Figure 14:
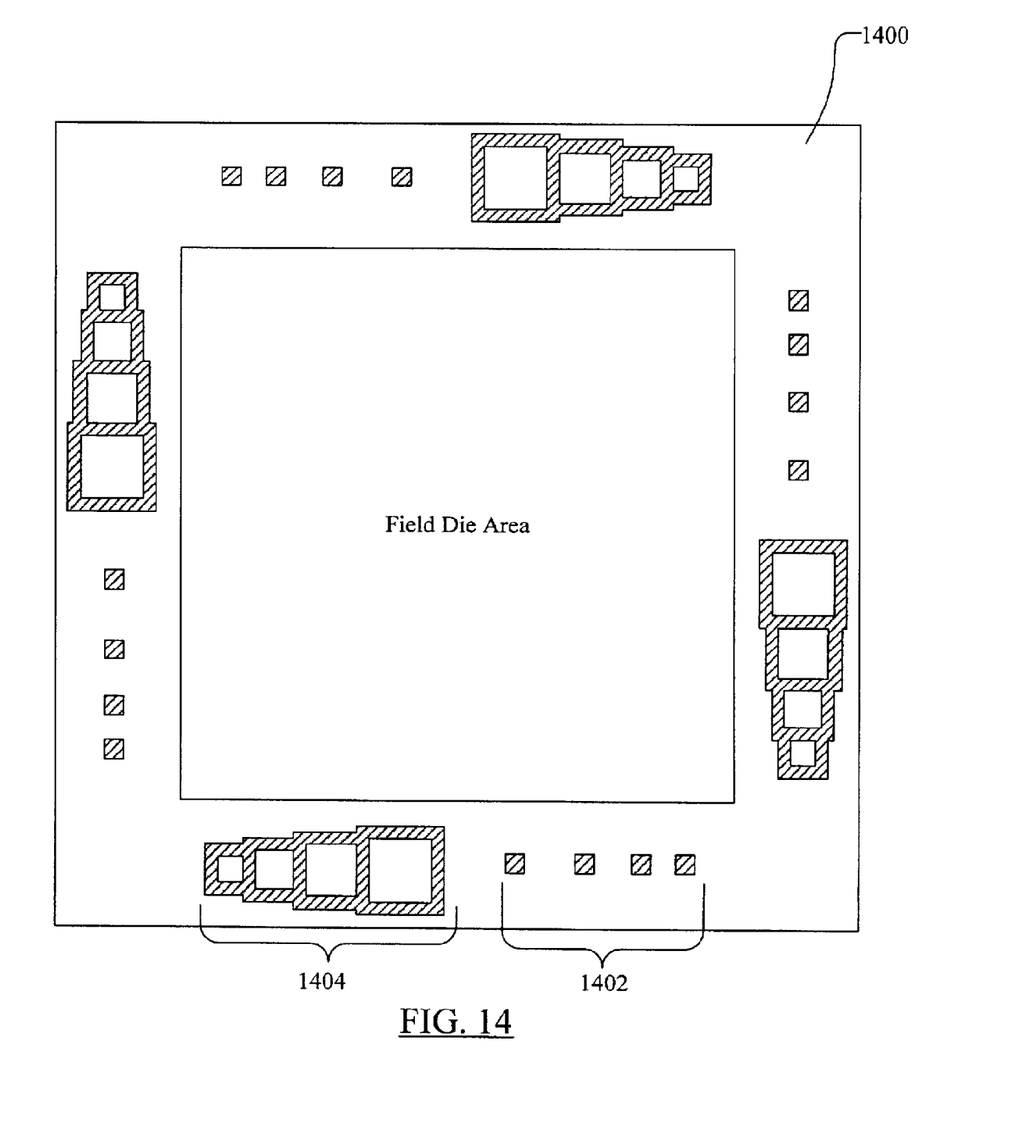
FIG. 14 illustrates a top view of test structure patterns on a photomask used with negative photoresist in accordance with one embodiment of the invention.

As understood by one skilled in the art, the concepts discussed herein can be implemented with a photomask used with negative photoresist where the transmission characteristics are reversed. FIG. 14 illustrates that a photomask 1400 with opaque inner patterns 1402 and translucent outer patterns 1404.

Various other adaptations and combinations of features of the embodiments disclosed are within the scope of the invention. Although four pairs of translucent inner boxes and opaque outer boxes are described above, any number of pairs can be used. Furthermore, although photomask and photoresist are described above, any type of mask and resist can be used. Numerous embodiments are encompassed by the following claims.

What is claimed is:

1. A test structure pattern, comprising:

a first scribe comprising:
   a first inner pattern of a first transmission characteristic;
   a second inner pattern of the first transmission characteristic, wherein the first inner pattern and the second inner pattern comprise equal outer perimeter;

a second scribe comprising:
   a first outer pattern of a second transmission characteristic, the first outer pattern being defined by a first frame pattern of the first transmission characteristic;
   a second outer pattern of the second transmission characteristic, the second outer pattern being defined by a second frame pattern of the first transmission characteristic, wherein the first frame pattern comprises a smaller outer perimeter and a smaller inner perimeter than the second frame pattern.

2. The test structure pattern of claim 1, wherein the test structure pattern is stepped between fields on a wafer and the first scribe and the second scribe overlap on a scribe lane between the fields so the first inner pattern is placed at least partially within the first outer pattern, and the second inner pattern is placed at least partially within the second outer pattern.

3. The test structure pattern of claim 1, wherein first transmission characteristic is translucent and the second transmission characteristic is opaque.

4. The test structure pattern of claim 1, wherein the first outer pattern and the second outer pattern have the same shape but different size than the first inner pattern and the second inner pattern.

5. The test structure pattern of claim 1, wherein the first inner pattern and the second inner pattern are square patterns.

6. The test structure pattern of claim 1, wherein the first outer pattern and the second outer pattern are square patterns.

7. The test structure pattern of claim 1, wherein the first frame pattern and the second frame pattern are square patterns.

8. The test structure pattern of claim 1, wherein an edge of the first frame pattern and an edge of the second frame pattern at least partially overlap.

9. The test structure pattern of claim 1, wherein the minimum difference of the dimensions of the first outer pattern and the dimension of the first inner pattern is equal to a critical dimension.

10. The test structure pattern of claim 1, wherein the minimum difference of the dimensions of the second outer pattern and the dimension of the second inner pattern is equal to a critical dimension.

11. The test structure pattern of claim 1, further comprising a die region, wherein the first scribe is located along an edge of the die region and the second scribe is located along an opposing edge of the die region.

* * * * *